(12) United States Patent
Agarwal et al.

(10) Patent No.: US 6,395,614 B2
(45) Date of Patent: May 28, 2002

(54) METHODS OF FORMING MATERIALS COMPRISING TUNGSTEN AND NITROGEN, AND METHODS OF FORMING CAPACITORS

(75) Inventors: Vishnu K. Agarwal; Gurtej S. Sandhu, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/751,075

(22) Filed: Dec. 29, 2000

Related U.S. Application Data

(62) Division of application No. 09/250,974, filed on Feb. 16, 1999.

(51) Int. Cl.$^7$ ............................................. H01L 21/20
(52) U.S. Cl. ...................... 438/396; 438/240; 438/253
(58) Field of Search ................................. 438/253, 254, 438/255, 396, 397, 398

(56) References Cited

U.S. PATENT DOCUMENTS 5,691,235 A * 11/1997 Meikle et al.
6,107,152 A * 8/2000 Derderian

FOREIGN PATENT DOCUMENTS

| EP | 0720214 A  |   | 3/1996 |
|----|------------|---|--------|
| EP | 0720214 A2 | * | 7/1996 |
| EP | 0840363 A1 | * | 5/1998 |
| EP | 0840363 A  |   | 6/1998 |

OTHER PUBLICATIONS

Petri et al., "Nitrogen Effect on Post–Nucleation Tungsten CVD Film Growth", 1998 IEEE, pp. 204–204, 2/1998.

\* cited by examiner

*Primary Examiner*—Tuan H. Nguyen
(74) *Attorney, Agent, or Firm*—Wells St. John P.S.

(57) ABSTRACT

In one aspect, the invention includes a method of forming a material comprising tungsten and nitrogen, comprising: a) providing a substrate; b) depositing a layer comprising tungsten and nitrogen over the substrate; and c) in a separate step from the depositing, exposing the layer comprising tungsten and nitrogen to a nitrogen-containing plasma. In another aspect, the invention includes a method of forming a capacitor, comprising: a) forming a first electrical node; b) forming a dielectric layer over the first electrical node; c) forming a second electrical node; and d) providing a layer comprising tungsten and nitrogen between the dielectric layer and one of the electrical nodes, the providing comprising; i) depositing a layer comprising tungsten and nitrogen; and ii) in a separate step from the depositing, exposing the layer comprising tungsten and nitrogen to a nitrogen-containing plasma.

16 Claims, 3 Drawing Sheets

US 6,395,614 B2

METHODS OF FORMING MATERIALS COMPRISING TUNGSTEN AND NITROGEN, AND METHODS OF FORMING CAPACITORS

RELATED PATENT DATA

This patent resulted from a divisional application of U.S. patent application Ser. No. 09/250,974, filed on Feb. 16, 1999.

TECHNICAL FIELD

The invention pertains to methods of forming materials comprising tungsten and nitrogen, and in an exemplary application pertains to methods of forming capacitors.

BACKGROUND OF THE INVENTION

Tungsten nitride has properties which render it particularly suitable for utilization in integrated circuitry. For instance, tungsten nitride is found to exhibit better or equivalent electrical properties when compared to such commonly utilized compositions as, for example, TiN. Further, tungsten nitride retains its good electrical properties after being subjected to relatively high temperature processing, such as a polysilicon anneal or borophosphosilicate glass (BPSG) reflow.

Tungsten nitride materials can be formed by, for example, chemical vapor deposition processes, such as, for example, plasma enhanced chemical vapor deposition (PECVD). The tungsten nitride materials formed by such methods can have good step coverage over an underlying substrate and be continuous, particularly if formed at lower working ends of temperature and plasma power ranges. However, utilization of such tungsten nitride materials has been limited due to difficulties in working with the materials. Specifically, tungsten nitride can peel, and/or bubble, and/or crack when exposed to high temperature processing (such as, for example, the greater than 800° C. processing associated with anneal steps). The peeling, cracking and bubbling lead to a non-continuous film. It would be desirable to develop methods of forming materials comprising tungsten nitride which overcome problems associated with tungsten nitride exposure to high temperature processing conditions.

SUMMARY OF THE INVENTION

In one aspect, the invention includes a method of forming a material comprising tungsten and nitrogen. A layer comprising tungsten and nitrogen is deposited over a substrate. Subsequently, and in a separate step from the depositing, the layer comprising tungsten and nitrogen is exposed to a nitrogen-containing plasma.

In another aspect, the invention includes a method of forming a capacitor. A first electrical node is formed and a dielectric layer is formed over the first electrical node. A second electrical node is formed and separated from the first electrical node by the dielectric layer. A layer comprising tungsten and nitrogen is provided between the dielectric layer and one of the electrical nodes. The providing the layer comprising tungsten and nitrogen includes: a) depositing a layer comprising tungsten and nitrogen; and b) in a separate step from the depositing, exposing the layer comprising tungsten and nitrogen to a nitrogen-containing plasma.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
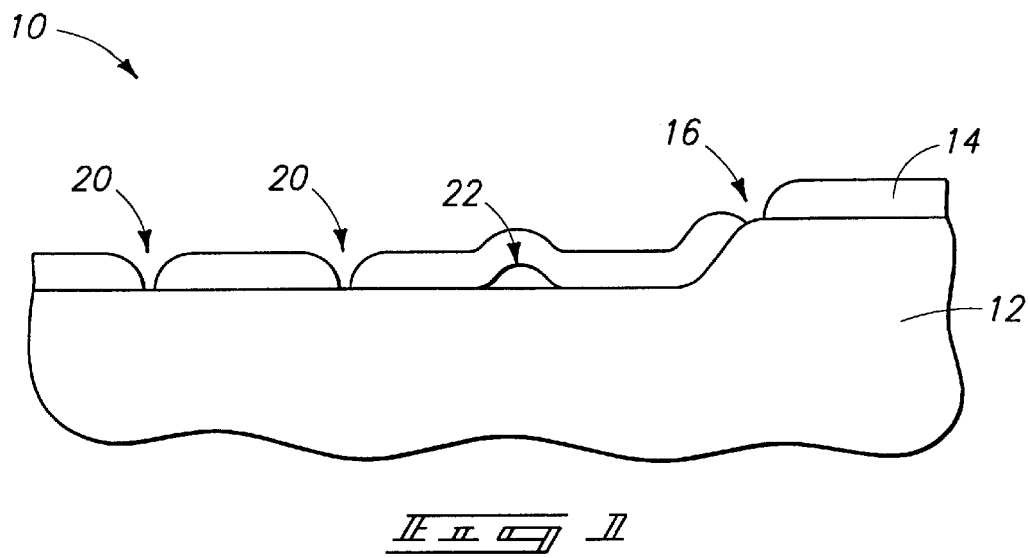
FIG. 1 is a fragmentary, diagrammatic, cross-sectional view of a semiconductor wafer fragment at a preliminary step of a method of the present invention.

The invention encompasses methods of forming materials comprising tungsten and nitrogen. An exemplary method of the present invention is described with reference to a semiconductor wafer fragment 10 in FIGS. 1 and 2. Referring to FIG. 1, wafer fragment 10 comprises a substrate 12 and a layer 14 formed over substrate 12. Substrate 12 includes a step 16. Substrate 12 can comprise, for example, a conductive material, or an insulative material. Exemplary conductive materials include, for example, conductively doped polysilicon and metals, such as, for example, copper. Conductive materials of substrate 12 can be incorporated into, for example, interconnect lines. Exemplary insulative materials include, for example, silicon dioxide, tantalum pentoxide ($Ta_2O_5$) and barium strontium titanate (BST). The insulative material can have a dielectric constant or "K" value which is greater than or equal to about 10. For instance, $Ta_2O_5$ comprises a "K" value of from about 10 to about 25, and BST comprises a "K" value of from about 80 to about 1,000 or greater.

Layer 14 comprises tungsten and nitrogen, and can, for example, consist essentially of tungsten nitride. Such tungsten nitride can have the chemical formula $WN_x$, wherein "x" is from 0.05 to 0.5. In one aspect, layer 14 is a tungsten nitride layer. Tungsten nitride layer 14 can be formed by, for example, chemical vapor deposition utilizing $WF_6$ and $N_2$ and $H_2$ as precursors, with either He or Ar as a carrier gas. The deposition can be plasma enhanced, with a plasma power of from about 50 watts to about 700 watts. A temperature of a substrate upon which deposition occurs can be from about 170° C. to about 550° C., and a pressure within the deposition chamber can be from about 500 mTorr to about 8 Torr. The described conditions are for deposition of tungsten nitride over a single semiconductor material wafer.

Tungsten nitride layer 14 is preferably formed to a thickness of from about 30 Å to about 2000 Å, and more preferably from about 50 Å to about 500 Å. An exemplary thickness of layer 14 is from about 150 Å to about 500 Å. The shown layer 14 has a number of defects. Specifically, voids (or cracks) 20 occur throughout layer 14. An additional defect is a bubble 22 formed within layer 14 at an interface of layer 14 and substrate 12. The above-described defects can occur either during deposition of layer 14, or during high temperature processing subsequent to the deposition.

Figure 2:
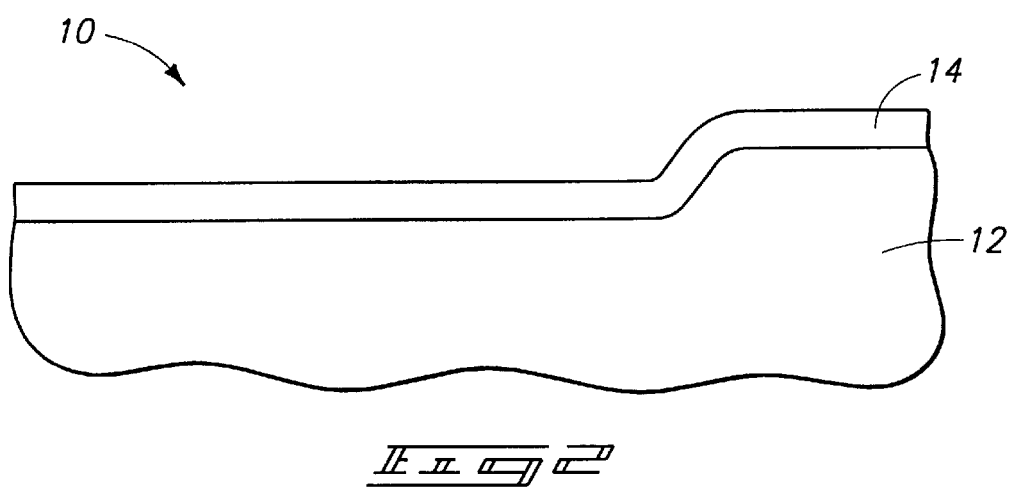
FIG. 2 is a view of the FIG. 1 wafer fragment shown at a processing step subsequent to that of FIG. 1.

Referring to FIG. 2, layer 14 is exposed to a nitrogen-containing plasma in accordance with a method of the present invention. Such exposure removes at least some of defects 20 and 22. After the exposure, layer 14 forms a stable film over substrate 12, with the term "stable" indicating that layer 14 is resistant to formation of cracks, voids or bubbles during subsequent processing.

The plasma to which layer 14 is exposed preferably comprises a nitrogen-containing compound that does not contain oxygen. Suitable compounds are, for example, $N_2$ and $NH_3$.

Exemplary conditions for treating layer 14 in accordance with the present invention include subjecting layer 14 to a plasma within a reaction chamber at a temperature of from about 170° C. to about 550° C., and a pressure of from about 500 mTorr to about 8 Torr. $N_2$ gas is flowed into the chamber at a rate of from about 50 standard cubic centimeters per minute (sccm) to about 800 sccm, and a plasma is maintained within the chamber at a plasma power of from about 100 watts to about 800 watts. One or more of $H_2$ and Ar can be flowed into the chamber in addition to the $N_2$. If $H_2$, is flowed, it is preferably flowed at a rate of from about 50 sccm to about 800 sccm, and if Ar is flowed, it is preferably flowed at a rate of from about 200 sccm to about 2,000 sccm. An exposure time of a substrate to the plasma of from about 10 seconds to about 80 seconds is found to be generally sufficient to cure defects in a tungsten nitride layer having a thickness of less than or equal to about 2000 Å, and to convert such layer to a stable film.

The treatment discussed above with reference to FIG. 2 is conducted in a discrete step separate from the step of forming layer 14 that is discussed with reference to FIG. 1. The separate step of FIG. 2 can, however, be conducted in the same chamber as the layer-forming step of FIG. 1 by ceasing the forming step while maintaining a plasma utilized for the forming step. For instance, in embodiments wherein $WF_6$ and either $N_2$ or $NH_3$ are utilized as precursors in the layer-forming step of FIG. 1, the layer-forming step can be stopped by ceasing a flow of $WF_6$ into the reaction chamber. If the nitrogen precursor flow and plasma are maintained within the chamber, the treatment described with reference to FIG. 2 can proceed.

Another aspect of the invention is described with reference to FIGS. 3 and 4. In this aspect, the layer 14 formed above by the processing of FIGS. 1 and 2 is utilized as a substrate for formation of a second layer 30 comprising tungsten and nitrogen. Second layer 30 can be formed by identical processing as that described above with reference to FIG. 1. Layer 30 can then be treated by processing analogous to that described above with reference to FIG. 2 to eliminate defects and form the construction illustrated in FIG. 4.

Figure 4:
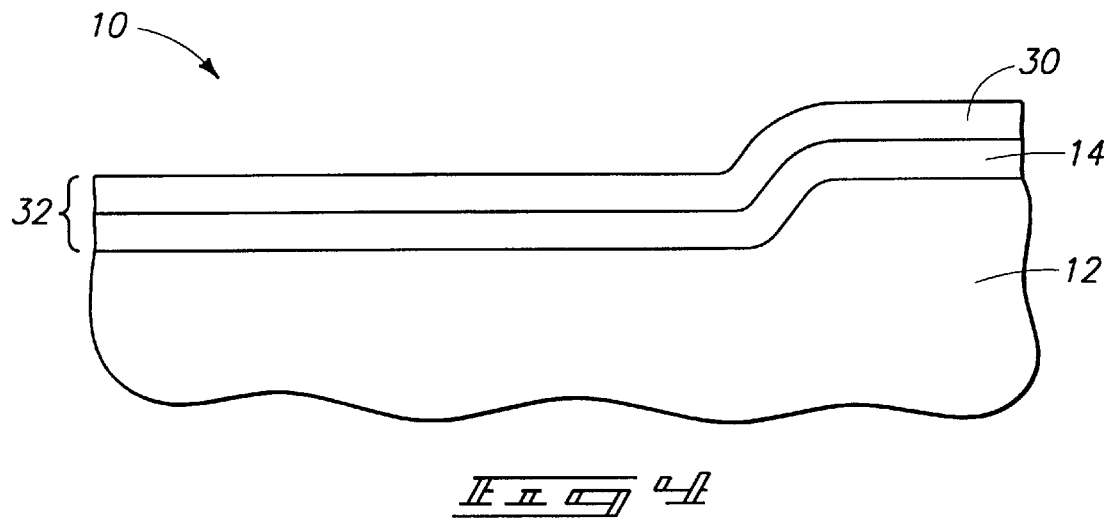
FIG. 4 is a view of the FIG. 1 wafer fragment shown at a processing step subsequent to that of FIG. 4.

Layers 14 and 30 of FIG. 4 together comprise a mass 32 of tungsten and nitrogen. The tungsten and nitrogen of mass 32 can, for example, be in the form of tungsten nitride.

It is noted that although the above-described embodiments illustrate a tungsten nitride material being treated with a plasma after formation of defects in the material, the invention also encompasses methods wherein a tungsten nitride material is treated with plasma before defects occur. For instance, in one aspect the invention encompasses treating a tungsten nitride material that is substantially free of defects with a plasma comprising a nitrogen-containing compound (preferably a nitrogen-containing compound that lacks oxygen). Such treatment can densify the tungsten nitride material to render it less susceptible to prior art problems associated with high temperature processing of tungsten nitride materials.

Figure 5:
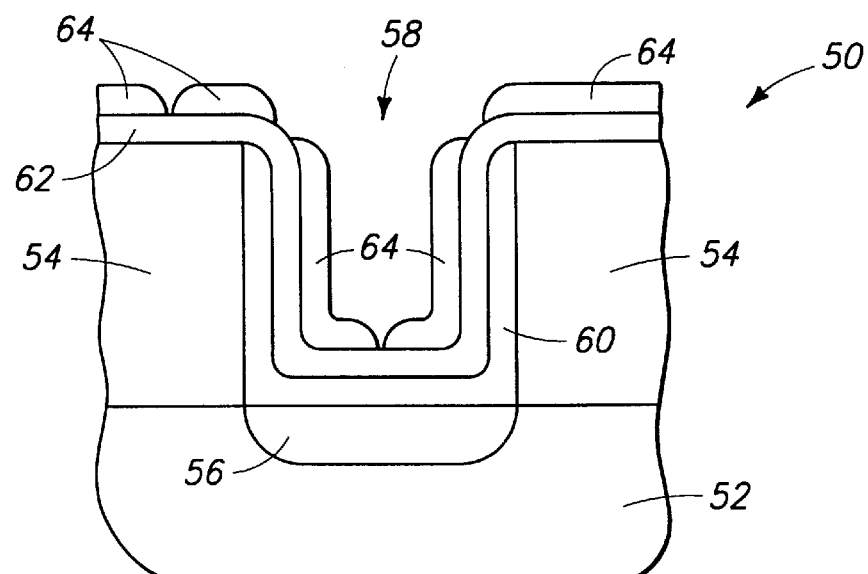
FIG. 5 is a fragmentary, diagrammatic, cross-sectional view of a semiconductor wafer fragment at a preliminary step of a second embodiment method of the present invention.

Another embodiment of the invention is described with reference to a semiconductor wafer fragment 50 in FIGS. 5–7. Referring to FIG. 5, wafer fragment 50 comprises a substrate 52 and an insulative layer 54 formed over substrate 52. Insulative layer 54 can comprise, for example, BPSG. Substrate 52 can comprise, for example, monocrystalline silicon lightly doped with a p-type background dopant. To aid in interpretation of the claims that follow, the term "semiconductive substrate" is defined to mean any construction comprising semiconductive material, including, but not limited to, bulk semiconductive material such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

An electrical node 56 is provided within substrate 52. Node 56 can comprise, for example, a conductively doped diffusion region. Such diffusion region can be formed by implanting a conductivity-enhancing impurity into substrate 52.

An opening 58 extends through insulative material layer 54 and to node 56. Opening 58 can be formed by conventional methods, such as, for example, an etch utilizing $CF_4/CHF_3$ and a plasma.

An electrically conductive material 60 is formed within opening 58, and a dielectric material 62 is formed over conductive material 60. Conductive material 60 and dielectric material 62 can be formed by conventional methods, such as, for example, chemical vapor deposition and photolithographic processing. Conductive material 60 can comprise, for example, a metal-containing layer, such as, titanium nitride or titanium. Alternatively, conductive material 60 can comprise conductively doped polysilicon. In yet other alternative embodiments, conductive material 60 can comprise tungsten nitride formed in accordance with the methods of the present invention described above. Dielectric material 62 can comprise, for example, a dielectric material having a "K" value greater than or equal to 10.

A layer 64 comprising tungsten and nitrogen is formed over dielectric material 62. Layer 64 can be formed by, for example, the processing described above with reference to FIG. 1, and comprises a number of defects. Generally, it is found to be particularly difficult to form tungsten nitride over dielectric materials having "K" values of greater than 10 utilizing prior art methods.

Figure 6:
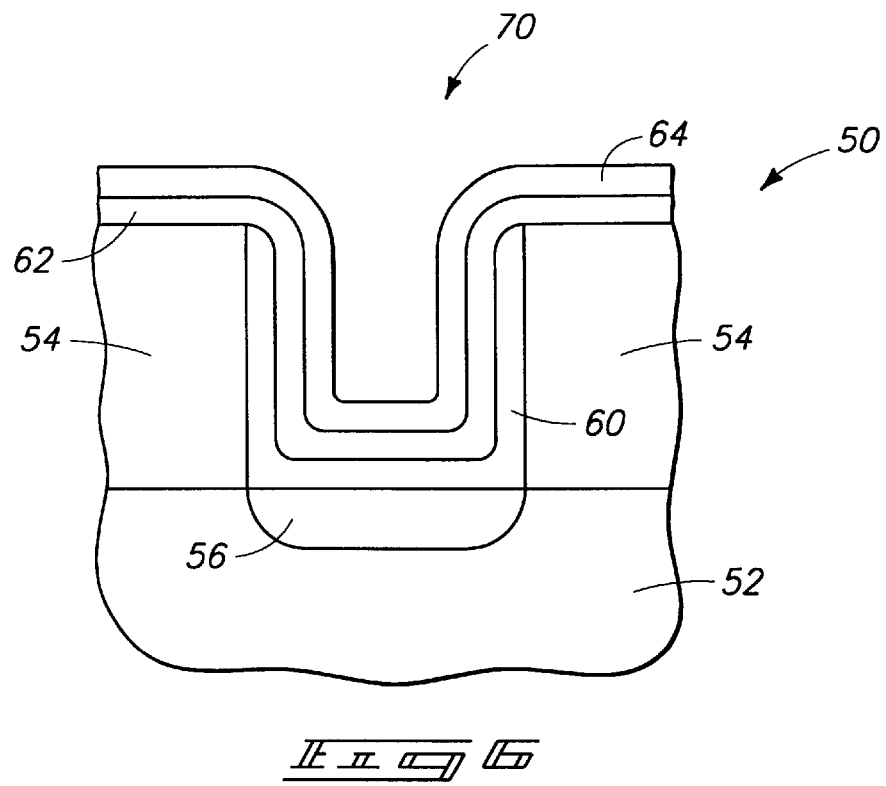
FIG. 6 is a view of the FIG. 5 wafer fragment shown at a processing step subsequent to that of FIG. 5.
Figure 7:
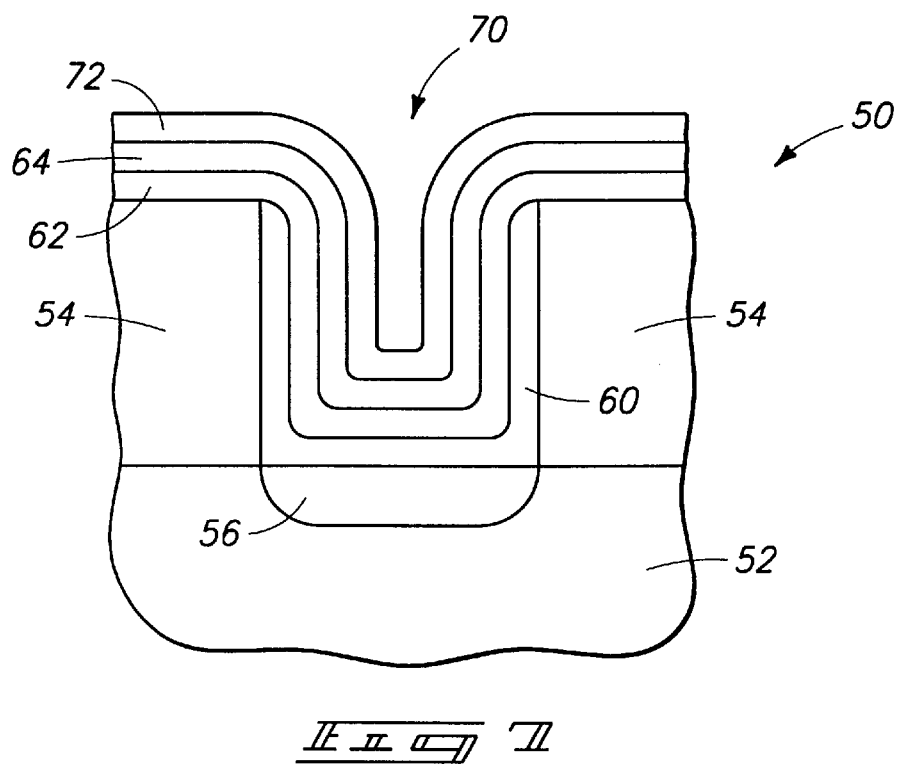
FIG. 7 is a view of the FIG. 5 wafer fragment shown at a processing step subsequent to that of FIG. 6.

Referring to FIG. 6, layer 64 is exposed to a nitrogen-containing plasma under conditions such as those described above with reference to FIG. 2. The exposure to the plasma removes the defects from layer 64 and converts layer 64 to a conformal and stable layer over dielectric material 62. Layers 60, 62 and 64 now together comprise a capacitor construction 70, with layers 60 and 64 comprising electrodes of such capacitor construction.

Capacitor construction 70 can be incorporated as is into integrated circuitry. Alternatively, subsequent processing can be conducted to add a second conductive layer over layer 64 to increase a thickness of the top electrode of capacitor 70. FIG. 7 illustrates wafer fragment 50 after such subsequent processing, and specifically illustrates an additional conductive layer 72 formed over layer 64. Layer 72 can comprise, for example, an additional tungsten nitride layer formed in accordance with the processing described above with reference to FIGS. 3 and 4. Alternatively, layer 72 can comprise a conductive material other than tungsten nitride, such as, for example, conductively doped polysilicon, or a metal-containing layer. In alternative methods of describing capacitor structure 70 of FIG. 7, layer 64 can be considered as part of an upper electrode of the capacitor structure, or as being between dielectric layer 62 and an upper electrode consisting of layer 72.

In the shown embodiment, capacitor construction 70 is a container-type capacitor. The invention encompasses other embodiments (not shown) wherein the capacitor has a shape other than a container-type structure.

In the shown embodiment, tungsten nitride layer 64 is formed between dielectric layer 62 and an upper conductive electrode 72. However, it is to be understood that the invention encompasses other embodiments (not shown) wherein layer 64 is formed between dielectric layer 62 and lower electrode 60, either in addition to, or alternatively to forming layer 64 between dielectric layer 62 and upper electrode 72.

It is noted that an advantage of providing tungsten nitride layer 64 between dielectric layer 62 and a capacitor electrode is that tungsten nitride layer 64 can function as a barrier layer to alleviate or prevent diffusion of materials between dielectric layer 62 and conductive layer 72.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a capacitor, comprising:
    forming a first electrical node;
    forming a dielectric layer over the first electrical node;
    forming a second electrical node separated from the first electrical node by the dielectric layer; and
    at least one of the first and second electrical nodes comprising tungsten and nitrogen, the forming said at least one of the nodes comprising;
        depositing a layer comprising tungsten and nitrogen in the form of $WN_x$, wherein x is from 0.05 to less than 0.5; and
        in a separate step from the depositing, exposing the layer comprising tungsten and nitrogen to a nitrogen-containing plasma.

2. The method of claim 1 wherein the depositing comprises plasma-enhanced CVD utilizing $WF_6$ and a nitrogen precursor, and wherein the exposing comprises ceasing the flow of $WF_6$.

3. The method of claim 1 wherein the nitrogen-containing plasma is formed from a nitrogen-containing compound that does not comprise oxygen.

4. The method of claim 1 wherein the nitrogen-containing plasma is formed from at least one of $N_2$ and $NH_3$.

5. The method of claim 1 wherein the layer comprising tungsten and nitrogen is a first layer, and further comprising forming a second layer comprising tungsten and nitrogen over said first layer.

6. A method of forming a capacitor, comprising:
    forming a first electrical node;
    forming a dielectric layer over the first electrical node;
    forming a second electrical node separated from the first electrical node by the dielectric layer; and
    providing a material comprising tungsten and nitrogen between the dielectric layer and at least one of the electrical nodes, the providing comprising;
        depositing a layer comprising tungsten and nitrogen in the form of $WN_x$, wherein x is from 0.05 to less than 0.5; and
        in a separate step from the depositing, exposing the layer comprising tungsten and nitrogen to a nitrogen-containing plasma.

7. The method of claim 6 wherein the material comprising tungsten and nitrogen is formed between the dielectric layer and only one of the electrical nodes.

8. The method of claim 6 wherein the material comprising tungsten and nitrogen is formed between the dielectric layer and both of the electrical nodes.

9. The method of claim 6 wherein the dielectric layer comprises a dielectric material having a "K" greater than or equal to 10.

10. The method of claim 9 wherein the dielectric material comprises at least one of $Ta_2O_5$ and BST.

11. The method of claim 6 wherein the depositing comprises plasma-enhanced CVD utilizing $WF_6$ and a nitrogen precursor.

12. The method of claim 11 wherein the nitrogen precursor comprises $N_2$.

13. The method of claim 6 wherein the depositing comprises plasma-enhanced CVD utilizing $WF_6$ and a nitrogen precursor, and wherein the exposing comprises ceasing the flow of $WF_6$.

14. The method of claim 6 wherein the nitrogen-containing plasma is formed from a nitrogen-containing compound that does not comprise oxygen.

15. The method of claim 6 wherein the nitrogen-containing plasma is formed from at least one of $N_2$ and $NH_3$.

16. The method of claim 6 wherein the layer comprising tungsten and nitrogen is a first layer, and further comprising forming a second layer comprising tungsten and nitrogen over said first layer.

* * * * *

UNITED STATES PATENT AND TRADEMARK OFFICE
CERTIFICATE OF CORRECTION

PATENT NO. : 6,395,614 B1  Page 1 of 1
DATED : May 28, 2002
INVENTOR(S) : Vishnu K. Agarwal et al.

Figure 3:
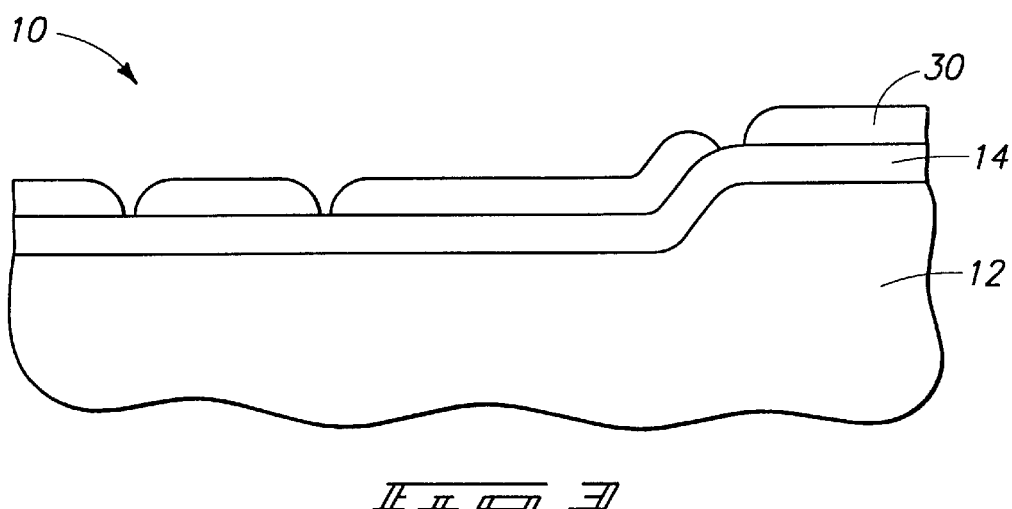
FIG. 3 is a view of the FIG. 1 wafer fragment shown at a processing step subsequent to that of FIG. 2.

It is certified that error appears in the above-identified patent and that said Letters Patent is hereby corrected as shown below:

Column 2,
Line 10, replace "FIG. 4" with -- FIG. 3 --.

Column 3,
Line 26, replace "If $H_2$, is" with -- If $H_2$ is --.

Signed and Sealed this

Fourth Day of February, 2003

JAMES E. ROGAN
*Director of the United States Patent and Trademark Office*